(12) United States Patent
Marakhtanov et al.

(10) Patent No.: US 7,837,826 B2
(45) Date of Patent: Nov. 23, 2010

(54) HYBRID RF CAPACITIVELY AND INDUCTIVELY COUPLED PLASMA SOURCE USING MULTIFREQUENCY RF POWERS AND METHODS OF USE THEREOF

(75) Inventors: Alexei Marakhtanov, Albany, CA (US); Rajinder Dhindsa, San Jose, CA (US); Eric Hudson, Berkeley, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 303 days.

(21) Appl. No.: 11/487,999

(22) Filed: Jul. 18, 2006

(65) Prior Publication Data

US 2008/0020574 A1    Jan. 24, 2008

(51) Int. Cl.
  *C23C 16/00* (2006.01)
  *H01L 21/306* (2006.01)

(52) U.S. Cl. .............................. 156/345.48; 118/723 I; 118/723 AN; 156/345.49

(58) Field of Classification Search ............. 118/723 E, 118/723 ER, 723 I, 723 IR, 723 AN; 156/345.46, 156/345.47, 345.48, 345.49; 315/111.51
  See application file for complete search history.

(56) References Cited

U.S. PATENT DOCUMENTS

| | | | |
|---|---|---|---|
| 4,842,683 A | 6/1989 | Cheng et al. | |
| 5,435,881 A | 7/1995 | Ogle | |
| 5,685,942 A * | 11/1997 | Ishii ....................... | 156/345.48 |
| 5,698,062 A * | 12/1997 | Sakamoto et al. ....... | 156/345.44 |
| 5,710,486 A * | 1/1998 | Ye et al. ................. | 315/111.21 |
| 5,865,896 A * | 2/1999 | Nowak et al. ............ | 118/723 I |
| 5,944,942 A * | 8/1999 | Ogle ...................... | 156/345.46 |
| 5,998,932 A | 12/1999 | Lenz | |
| 6,019,060 A * | 2/2000 | Lenz ....................... | 118/723 R |
| 6,204,607 B1 * | 3/2001 | Ellingboe ............... | 315/111.51 |
| 6,422,172 B1 * | 7/2002 | Tanaka et al. ........... | 118/723 R |
| 6,475,336 B1 | 11/2002 | Hubacek | |
| 6,508,913 B2 | 1/2003 | McMillin et al. | |
| 6,824,627 B2 | 11/2004 | Dhindsa et al. | |
| 6,972,524 B1 | 12/2005 | Marakhtanov et al. | |
| 2003/0015965 A1* | 1/2003 | Godyak .................. | 315/111.21 |
| 2003/0218427 A1 | 11/2003 | Hoffman et al. | |
| 2004/0175953 A1* | 9/2004 | Ogle .......................... | 438/710 |

OTHER PUBLICATIONS

Yang, et al., Magnetically Enhanced Multiple Frequency Capacitively Coupled Plasmas: Dynamics and Strategies, Iowa State University, http://uigelz.ece.iastate.edu, Oct. 2005.
Lee, et al., Characterization of Inductively Coupled Plasma Driven with Ferrite Cores at 400 kHz, HanYang Univ., Seoul, Korea, Presentation at PEUG 2003.
PCT International Search Report and The Written Opinion of the International Searching Authority dated Sep. 19, 2008 [International Application No. PCT/US07/15928].

* cited by examiner

*Primary Examiner*—Luz L. Alejandro
(74) *Attorney, Agent, or Firm*—Buchanan Ingersoll & Rooney PC

(57) ABSTRACT

A device for inductively confining capacitively coupled RF plasma formed in a plasma processing apparatus. The apparatus includes an upper electrode and a lower electrode that is adapted to support a substrate and to generate the plasma between the substrate and the upper electrode. The device includes a dielectric support ring that concentrically surrounds the upper electrode and a plurality of coil units mounted on the dielectric support ring. Each coil unit includes a ferromagnetic core positioned along a radial direction of the dielectric support ring and at least one coil wound around each ferromagnetic core. The coil units generate, upon receiving RF power from an RF power source, electric and magnetic fields that reduce the number of charged particles of the plasma diffusing away from the plasma.

28 Claims, 9 Drawing Sheets

HYBRID RF CAPACITIVELY AND INDUCTIVELY COUPLED PLASMA SOURCE USING MULTIFREQUENCY RF POWERS AND METHODS OF USE THEREOF

BACKGROUND

Integrated circuits have become a primary component in most of current electronic systems due to a low cost, high reliability, and speed. Fabrication of the integrated circuits begins with a substrate where each substrate is subjected to steps that form various circuit structures on the substrate. Typically, plasma (or, ionized gas) is used to perform process steps that include depositing material onto the surface of the substrate as well as removing and selectively etching patterns on the surface.

Typically, the plasma is formed above the surface of the substrate by adding energy to the process gas at low pressure. The resulting plasma may contain ions, free radicals, and neutral species with high kinetic energies. In plasma etching, the charged particles in the plasma can be directed to impinge upon the unmasked regions of the substrate and thereby remove atoms or molecules from the substrate.

Any non-uniformity of the plasma characteristics may cause uneven reaction rates along the surface of the substrate, which may decrease the manufacturing yield. As the substrate diameter tends to increase and transistor sizes formed on the substrate decrease, the non-uniformity has become one of the major complexities in plasma processing systems. Thus, there is a need for a plasma processing system that promotes plasma uniformity over the entire surface of the substrate.

Modern plasma etch tools use multiple knobs to control process parameters, such as plasma density and uniformity, chemical composition of plasma, ion energy and ion energy distribution near the substrate surface. New generation plasma processing systems require tighter control of these parameters in order to meet the requirements of technological challenges, such as shrinking feature size and new stack materials. As such, there is a need for an advanced plasma processing apparatus that allows a user to have an enhanced control of these parameters.

SUMMARY

According to one embodiment, a device for confining a capacitively coupled RF plasma (CCP) formed in a plasma processing apparatus includes an inductively coupled RF plasma source that has a dielectric support ring surrounding the upper electrode for generating a capacitively coupled RF plasma, and coil units positioned on the dielectric support ring. The coil units may be connected to an RF source and generate magnetic and electric fields around the capacitively coupled RF plasma so as to confine the plasma. The inductively coupled RF plasma source also contributes to igniting and sustaining the plasma.

In one embodiment, the upper electrode has a circular end surface which cooperates with a powered electrode supporting a substrate to generate a plasma between the substrate and the circular end surface during operation. The device may include: a dielectric support ring adapted to concentrically surround the circular end surface; and a plurality of coil units mounted on the dielectric support ring, each of the coil units including a ferromagnetic core positioned along a radial direction of the dielectric support ring and a first coil wound around the ferromagnetic core and coupled to a first radio frequency (RF) power source. Upon receiving RF power from the first RF power source, the coil units may generate electric and magnetic fields. The electric and magnetic fields may surround the plasma along the periphery of the circular end surface and reduce the number of charged particles diffusing away thereby confining the plasma.

In another embodiment, a plasma processing apparatus may include: a first radio frequency (RF) source; a chuck positioned on a bottom electrode and adapted to generate a clamping force on a substrate mounted thereon; an upper electrode positioned over the chuck and including a surface that faces the substrate, the lower electrode and upper electrode being adapted to generate plasma in a space between the upper electrode and the substrate upon supply of RF power from the first RF source to the upper or lower electrode; a dielectric support ring concentrically surrounding the upper electrode; and a plurality of coil units mounted on the dielectric support ring, each of the coil units including a ferromagnetic core positioned along a radial direction of the dielectric support ring and a first coil. The first coil may be wound around the ferromagnetic core and coupled to a second radio frequency (RF) power source. Upon receiving RF power from the second RF power source, the coil units may generate electric and magnetic fields to reduce the number of charged particles diffusing away from the plasma and thereby confine the plasma.

DETAILED DESCRIPTION

A hybrid capacitively coupled plasma process apparatus includes an inductively coupled RF source surrounding the capacitively coupled plasma source. Certain embodiments may provide, inter alia, an additional control of radial and azimuthal plasma density distribution at the plasma periphery, and thereby provide a mechanism for tuning plasma uniformity at the edge of a substrate. The inductively coupled plasma source may include a plurality of ferromagnetic coils that promote plasma confinement. Furthermore, the inductively coupled plasma source may promote cleaning capabilities of the plasma processing chamber and increase the lifetime of consumable chamber components.

In capacitively coupled plasma systems, plasma is generated by a pair of closely spaced electrode plates. The use of planar electrodes in a parallel plate plasma reactor may result in a non-uniform plasma density across the surface of a substrate, especially in the region near the edge. This type of non-uniformity may be azimuthally symmetric or radial, e.g. the etch rate near the center may be different from the etch rate near the edge. An edge ring may be mounted around the edge of the substrate so as to promote plasma uniformity near the edge.

Figure 1:
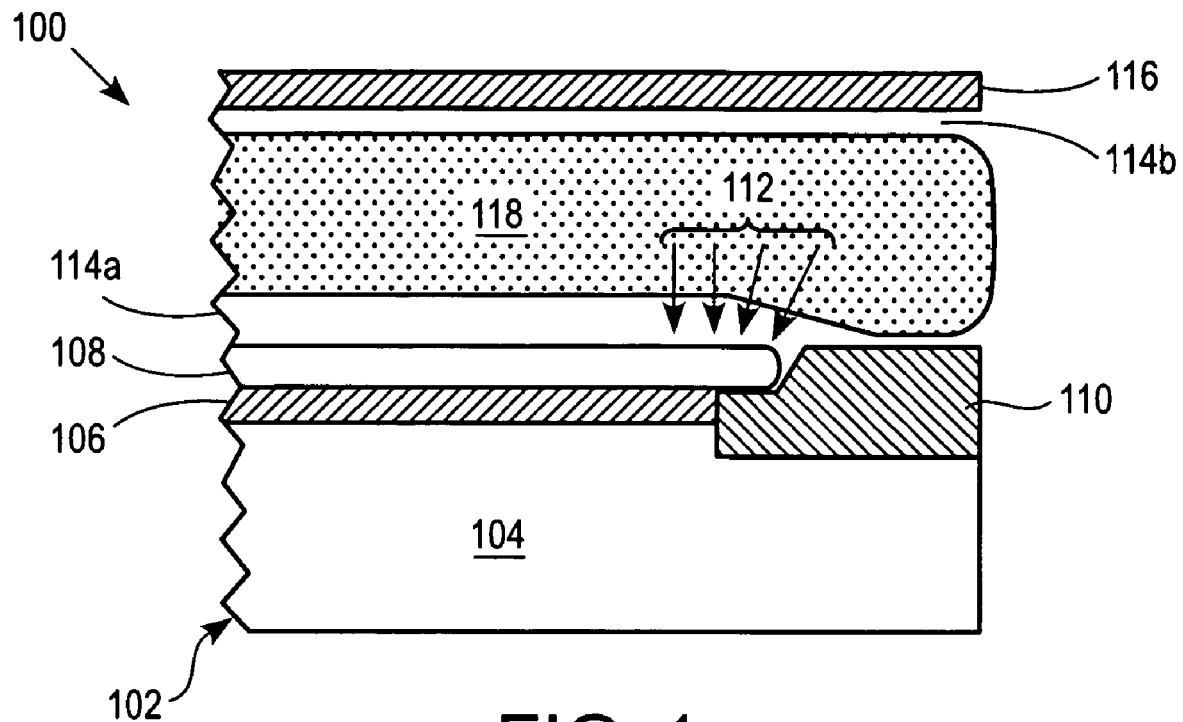
FIG. 1 shows a partial cross sectional view of a conventional parallel plate capacitively coupled plasma generating device.

FIG. 1 shows a partial cross sectional view of a parallel plate or capacitively coupled plasma device shown at 100 and illustrating an edge ring 110 surrounding a substrate 108 in accordance with an embodiment. The device shown at 100 may include: a substrate support unit 102 that comprises an electrode 104 and an electrostatic chuck 106 for holding the substrate 108 in place; and an upper showerhead electrode 116. The edge ring 110 may be a replaceable component which tends to become hot during processing of the substrate and sometimes is referred to as a hot edge ring (HER). The edge ring 110 may be made from conductive electrode materials such as SiC and silicon or from dielectric materials such as quartz. Plasma 118 may be formed between the upper electrode 116 and the substrate 108. Plasma sheaths 114a and 114b may be formed on the surfaces of the substrate 108 and the upper electrode 116, respectively. During plasma etching, ion species from plasma 118 gains energy as they cross the plasma sheath 114a prior to impacting on the surface of substrate 108.

Even though the edge ring 110 may reduce the plasma non-uniformity, the thickness and contour of the plasma sheath 114a near the edge of the substrate 108 may be deformed as depicted in FIG. 1. As detailed in conjunction with FIG. 3, the device 100 may be operated in tandem with an inductively coupled RF plasma source that extends the plasma 118 further beyond the edge ring 110 in the radial direction, thereby reducing the deformation of the plasma sheaths 114a-114b near the edge of the substrate 108. The plasma 118 depicted in FIG. 1 may be generated when the device 100 is operated in a mode where the inductively coupled RF source (shown in FIG. 3) is not turned on during operation.

The plasma sheaths 114a-114b may be deformed near the edge of the substrate 108. As a consequence, the ion species from the plasma 118 may impact the surface of the substrate 108 at various angles from the normal to the surface of the substrate 108. The arrows 112 in FIG. 1 represent travel directions of the ion species within the sheath 114a.

Figure 2:
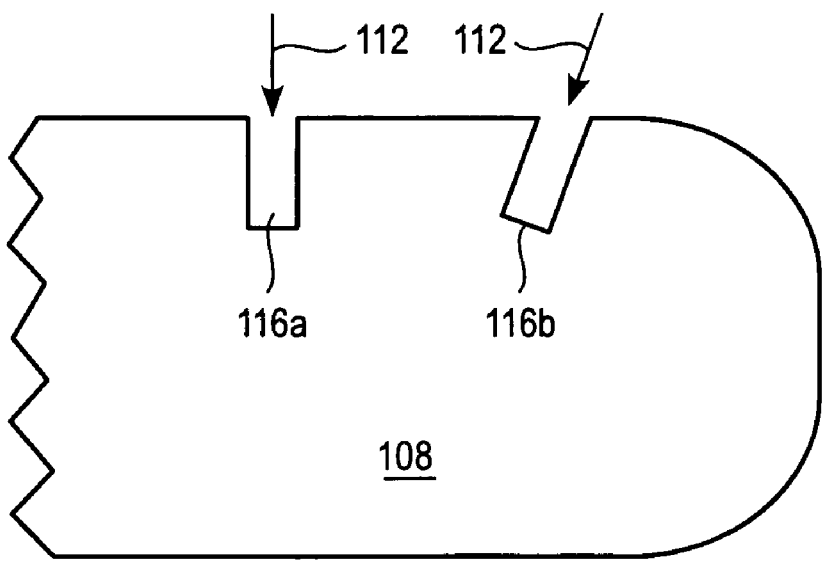
FIG. 2 shows a partial cross sectional view of a substrate processed in the conventional mode as depicted in FIG. 1.

FIG. 2 represents an exaggerated partial cross sectional view of the substrate 108 near its edge, wherein the substrate is processed in the conventional mode as depicted in FIG. 1. As illustrated in FIG. 2, an etched portion 116a located away from the edge may be formed in a direction normal to the surface of the substrate 108, while an etched portion 116b located near the edge may be formed in a direction at an angle with respect to the normal to the surface. As such, a defective edge portion of the substrate 108 may be discarded, which translates into a manufacturing loss.

Figure 3:
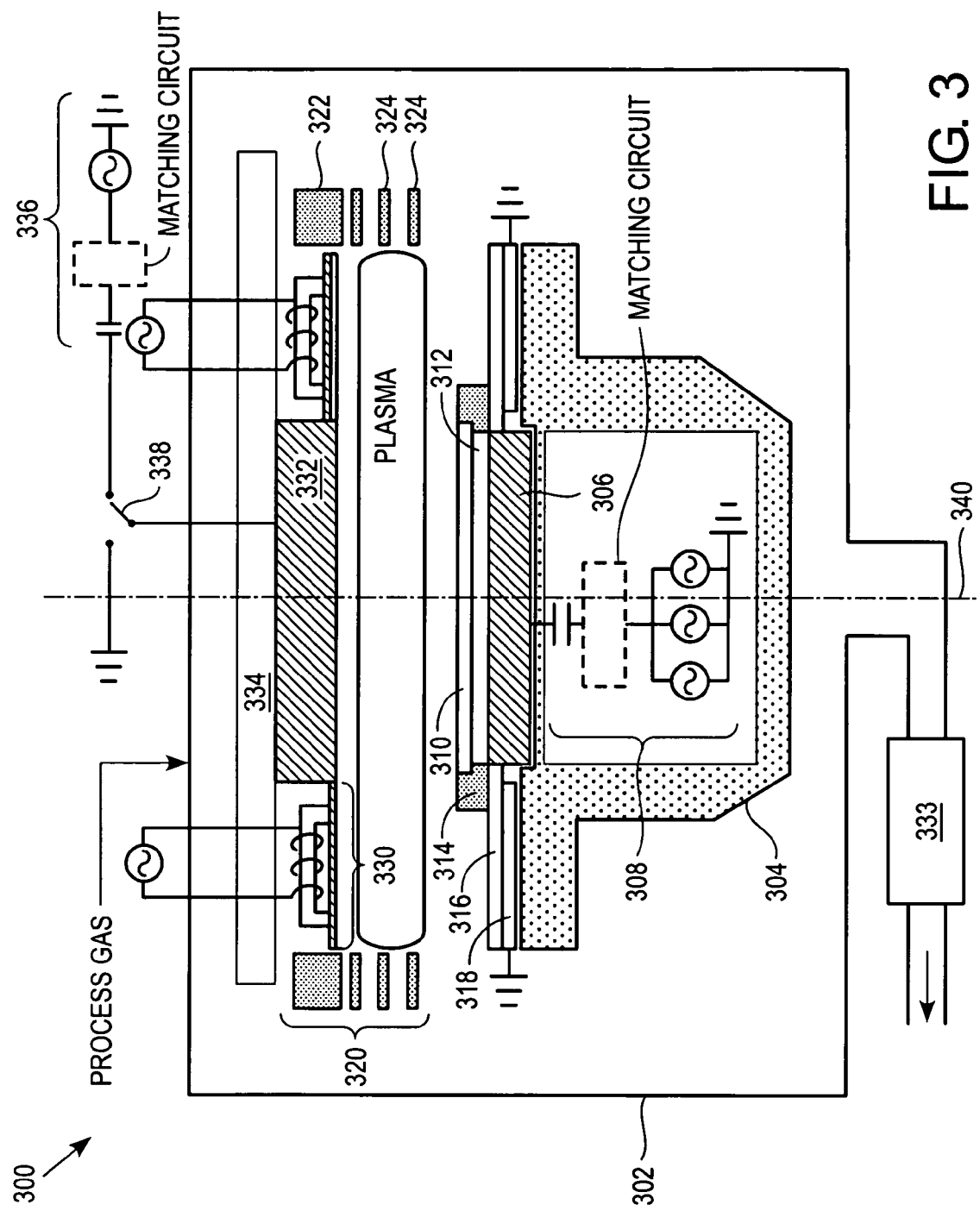
FIG. 3 shows a cross sectional view of an exemplary plasma process apparatus in accordance with an embodiment.

FIG. 3 shows a cross sectional view of an exemplary plasma process apparatus shown at 300 for processing a substrate 310 in accordance with an embodiment. The substrate 310 may be a wafer made from various materials, such as semiconductor, dielectric and metal. As depicted, the apparatus shown at 300 may include a substantially cylindrical chamber 302 for providing low pressure therewithin. The apparatus shown at 300 may be capable of introducing a process gas into the chamber 302 through a showerhead electrode 332 and igniting the process gas into a capacitively coupled RF plasma. The chamber pressure may be typically in the range of 0.1 to 1000 mtorr, wherein a vacuum pump 333 may withdraw gas from the bottom of the chamber 302.

The apparatus shown at 300 may include: a lower electrode 306; a base 304 for supporting the lower electrode 306; an edge ring 314 surrounding the substrate 310 and the chuck 312; an RF power supply unit 308 (detailed description is given in conjunction with FIG. 4) for supplying RF power to the lower electrode 306; a dielectric ring 316 positioned beneath the edge ring 314 and configured to conduct a plasma current; a conductor ring 318, such as an aluminum ring, connected to the dielectric ring 316 and the ground and configured to discharge the plasma current transmitted from the dielectric ring 316. The apparatus may further include: an upper electrode 332 having a generally circular disc shape; an inductively coupled RF plasma source (or, shortly, inductive RF source) 330; a temperature controlled top plate 334; and confinement ring assembly 320 including confinement rings 324 that surround the plasma during operation and confine the plasma within the region surrounded thereby and improve process control, and an adjustment mechanism 322 for adjusting the spacing between the confinement rings 324. Detailed description of the inductive RF source 330 is given with reference to FIG. 4.

The apparatus shown at 300 may further include a switch 338 coupled to the upper electrode 332. In one operational mode, the switch 338 may connect the upper electrode 332 to the ground. In this mode, the lower electrode 306 may be the powered electrode and form a capacitively coupled plasma between the upper electrode 332 and the substrate 310. In another operational mode, the switch 338 may couple the upper electrode 332 to another RF power supply unit 336. Detailed description of the RF power supply unit 336 is given in conjunction with FIG. 4.

The plasma confinement rings 324 are shown surrounding the plasma formed between the upper electrode 332 and the substrate 310 and arranged coaxially with respect to the central axis 340 of the substrate 310. The confinement rings 324 may include a structure, such as ring shaped louvers, designed to reduce the number of charged particles flowing away from the plasma and permit uncharged gas molecules to flow from the confinement region in a generally horizontal direction. The neutral gas molecules may flow through one or more gaps between the confinement rings 324 in the vicinity of the periphery of the confinement region. From the gaps, the uncharged gas may flow in a region of the chamber 302 between the confinement region and the chamber wall to an outlet of the chamber connected to the vacuum pump 333. The confinement rings 324 may preferably include three grounded louvers (not shown) and made from silicon carbide doped to have a high electrical conductivity on the order of $2 \times 10^3$ ohm-centimeters and able to withstand the harsh environment of the plasma. The confinement rings 324 may be made from other materials having high electrical conductivity, e.g., aluminum or graphite.

To assist in providing the required plasma confinement for different pressure and gas flow conditions between the plasma region and the remainder of the chamber 302, the spacing between the confinement rings 324 may be changed by the adjustment mechanism 322. The adjustment mechanism 322 may be a conventional mechanical mechanism coupled between a motor (not shown) and the louver arrangement. The variable spacing may help to determine the gas pressure of the plasma and the rate of gas flow from the plasma region to the vacuum pump 333, and thereby to assist in controlling the plasma pressure, degree of plasma confinement, and gas flow rate. The adjustment mechanism 322 may be driven by a control signal from a controller (not shown). Further details of a plasma confinement ring arrangement can be found in commonly owned U.S. Pat. No. 5,998,932, which is incorporated herein by reference in its entirety.

In FIG. 3, the upper electrode 332 is shown to have a shape of substantially circular plate. The upper electrode 332 may have other alternative shapes. For instance, the upper electrode 332 may have a protrusion step formed near the periphery thereof. In another arrangement, the upper electrode 332 may include an inner electrode member made of single crystal silicon and an outer electrode member made of a single piece of material, such as chemical vapor deposition (CVD) silicon carbide, single crystal silicon or other suitable material. The outer electrode may be a continuous member or a segmented member (e.g., 2-6 separate segments arranged in a ring configuration). Further details of the stepped electrode can be found in commonly owned U.S. Pat. No. 6,824,627, which is incorporated herein by reference in its entirety.

Various types of gas injection systems may be used in the apparatus shown at 300. For instance, a showerhead assembly Exelan 2300™, available from assignee Lam Research Corporation, Fremont, Calif., may be installed inside the chamber 302. Another exemplary gas injection system can be found in commonly owned U.S. Pat. No. 6,508,913, which is incorporated herein by reference in its entirety. It should be apparent to those of ordinary skill in the art that other suitable types of gas injection systems may be used in apparatus 300.

The edge ring or focus ring 314 may be a replaceable component which can become hot during processing of a substrate and sometimes is referred to as a hot edge ring (HER). The edge ring 314 may be made from conductive electrode materials such as SiC and silicon or from dielectric materials such as quartz. Further details of the edge ring 314 can be found in commonly owned U.S. Pat. No. 5,998,932, which is incorporated herein by reference in its entirety.

The chuck 312 may be an electrostatic chuck. Alternatively, the lower electrode 306 may be arranged as an electrostatic chuck connected to a DC chucking voltage source (not shown), in which case the lower electrode 306 may include an arrangement (not shown) for cooling substrate 310 while the substrate 310 is being processed by plasma in the chamber 302. In such a case, the lower electrode 306 and chuck 312 may be formed as one component. A chuck other than an electrostatic chuck may be used if desired.

As discussed above, the upper electrode 332 and lower electrode 306 may generate a capacitively coupled plasma between the upper electrode 332 and the substrate 310 by energizing the process gas injected into the chamber 302. A portion of the uncharged particles, such as ions and electrons, of the plasma may pass through the confinement rings 324 and thence discharge from the chamber by way of the vacuum pump 333. The confinement rings 324 preferably reduce the number of charged particles diffusing away from the plasma, i.e., the charged particles that escape through the gaps between the confinement rings 324. To help trap the charged particles within the plasma region and thereby to reduce the number of charged particles diffusing away from the plasma, the inductive RF source 330 may be positioned around the plasma as detailed with reference to FIGS. 4-11.

Figure 4:
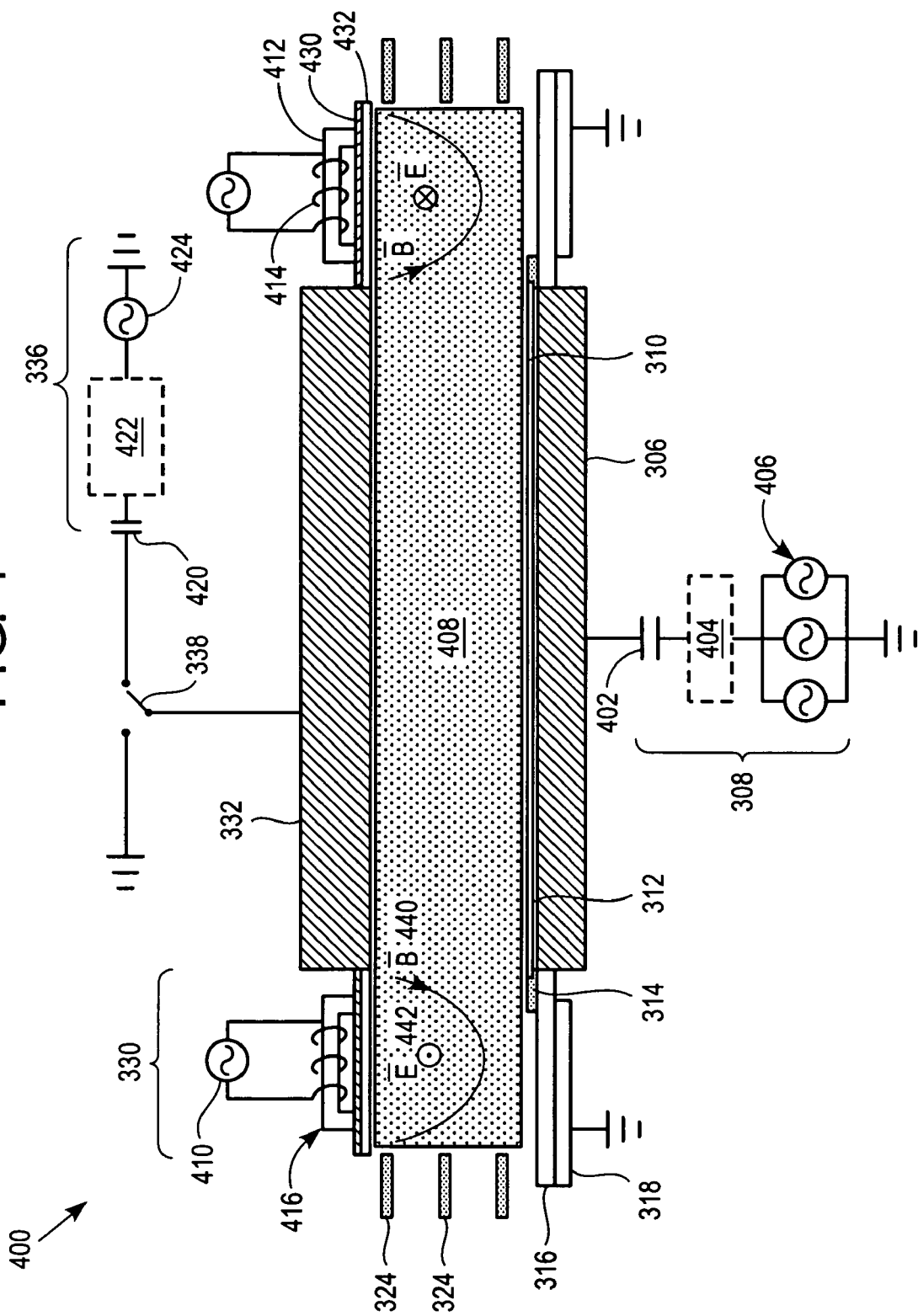
FIG. 4 shows a schematic diagram of the circuitry of the apparatus in FIG. 3 for energizing process gas into plasma.

FIG. 4 shows a schematic diagram of the circuitry of the apparatus shown at 400 for energizing process gas into a plasma state and confining the plasma. As depicted, the lower electrode 306 may be coupled to the RF power supply unit 308. The RF power supply unit 308 may include a multiple-frequency RF source 406 and optionally a capacitor 402 and/or a matching network 404. Alternatively, a matching network may be used for each of the RF sources 406. The process gas may be converted into the plasma 408 in response to electric field that electrodes 306 and 332 couple to the excitation region at one or more frequencies. The RF source 406 may be a single RF source operating at a single frequency RF source or multiple RF sources, e.g., three RF sources operating at various frequencies, e.g., 2, 27, and 60 MHz. In general, the amount of power at high frequencies supplied to the lower electrode 306 may primarily control the density of the plasma 408, while the amount of power at low frequencies supplied to the lower electrode 306 may primarily control the ion energy in the plasma 408. It is to be understood that other frequencies may be used by the RF source 406 to control the plasma density and ion energy as well as other parameters of the plasma 408.

The switch 338 may connect the upper electrode 332 to another RF power source unit 336. The RF power source unit 336 may include an RF source 424 and optionally a capacitor 420 and/or a matching network 422. As in the case of the RF power source unit 308, the RF source 424 may have one or more sources operating at one or more frequencies, respectively. In such a case, a matching network may be installed between the upper electrode 332 and each of the RF sources.

As depicted in FIG. 4, the inductive RF source 330 may generate electric fields 442 and magnetic fields 440 around the periphery of the plasma 408. The electric fields 442 and magnetic fields 440 preferably reduce the number of charged particles diffusing away from the plasma 408 through the gaps between the confinement rings 324 and thereby further confine the plasma 408. Charged particles of the plasma 408 may be trapped by the electric field 442, which results in extending the plasma 408 to the region below the inductive RF source 330 and thereby reducing the non-uniformity of the plasma 408 near the edge of the substrate. The inductive RF source 330 may include: a plurality of coil units 416, each coil unit having a coil 414 connected to an RF source 410 and wound around a ferromagnetic core 412; and a dielectric support ring 432 for supporting the coil units 416 thereon. The dielectric support ring 432 can be mounted to the electrode 332 and/or to the top plate 334 by any suitable arrangement. Optionally, a conductor ring 430, which is preferably formed of metal, may be formed on the dielectric ring 432 and grounded to discharge the plasma current when the switch 338 connects the upper electrode 332 to the ground. More details of the conductor ring 430 are given with reference to FIG. 6. A preferred frequency range of the RF source 410 for the coils 414 may be from 10 KHz to 1 MHz. When powered, the coil units 416 may contribute to igniting and sustaining the plasma 408 as well as confining the plasma.

The charged particles confined by the electric field 442 may promote plasma strike during the plasma ignition process at low pressures within the chamber 302. Also, the plasma confinement may reduce the deposition of material, such as polymer by-products, on the confinement rings 324 and, as a consequence, increase the lifetime of the confinement rings 324 and the time interval for cleaning the confinement rings 324. The inductive RF source 330 may be used as a tool for cleaning various chamber components, such as the confinement rings 324, the edge rings 314, chuck 312, etc. By injecting cleaning gas into the chamber 302 and expanding the plasma to the region near the confinement rings 324, the chemical depositions formed on the surfaces of these components can be effectively removed. The inductive RF source 330 may contribute to maintaining the density of charged particles as well as other chemical species within the plasma, and thereby contribute to sustaining the plasma. The inductive RF source 330 may also contribute to generating charged particles and other chemical species within the plasma.

Figure 5:
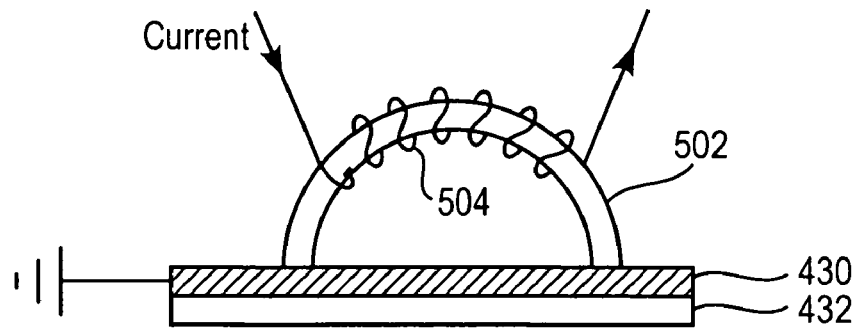
FIG. 5 shows is an alternative embodiment of the ferromagnetic core used in the apparatus in FIG. 3.

The ferromagnetic core 412 may be formed from ferromagnetic material, such as ferrite, and have various shapes. FIG. 5 shows an alternative embodiment of the ferromagnetic core 502 having a semicircular shape and coil 504 wound around the ferromagnetic core 502 that may be used in the inductive RF source 330. It should be apparent to those of ordinary skill that ferromagnetic cores having other suitable shapes can also be used.

Figure 6:
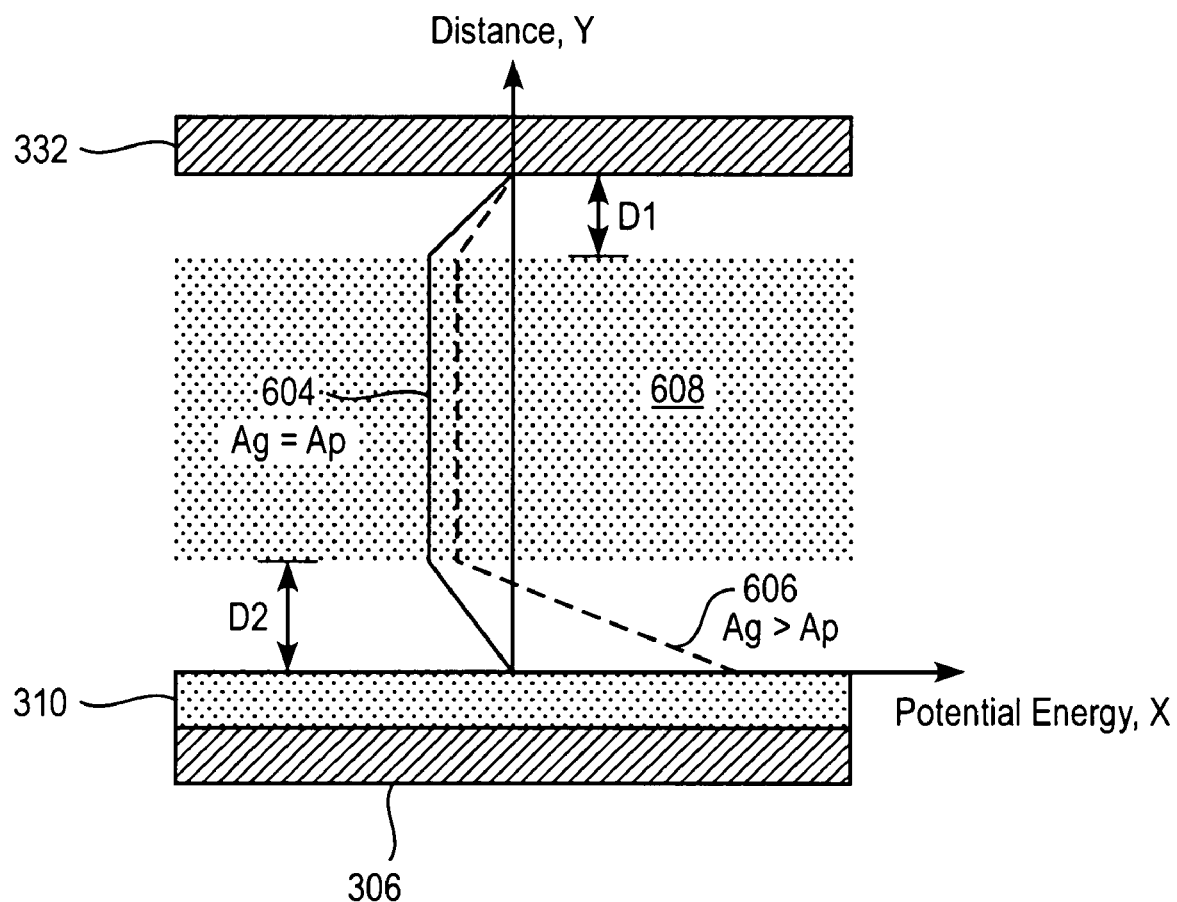
FIG. 6 shows a plot of time-average potential distribution within electrode gap along a direction normal to the surface of a substrate.

As discussed above in conjunction with FIG. 4, an optional conductor ring 430 may be formed between the coil units 416 and dielectric support ring 432. When the switch 338 grounds the upper electrode 332, the conductor ring 430 may be also grounded to increase the effective area of the upper electrode or grounded electrode 332. The area ratio between the upper electrode 332 and the lower electrode or powered electrode 306, Ag/Ap, may have an effect on the electrical potential energy distribution within plasma sheath regions. FIG. 6 shows a graph of electrical potential energy distribution within plasma 608 along the direction normal to the surface of the substrate 310. In FIG. 6, the Y-axis represents the distance from the substrate surface and X-axis represents the electrical potential of the plasma formed between the grounded electrode 322 and substrate surface. Two plasma sheaths D1 and D2 may be formed at the surfaces of the upper electrode 332 and substrate 310, respectively. As the ion particles impinging the substrate surface may be accelerated mainly in the region of the plasma sheath D2, the electrical potential distribution across the sheath D2 may affect the efficacy of the plasma etching. The plots 604 and 606 respectively represent the potential energy distributions for two cases; $A_g=A_p$, and $A_g>A_p$. As depicted in FIG. 6, the electrical potential difference across the plasma sheath D2 is larger in the case when the upper electrode area $A_g$ is larger than the powered electrode area $A_p$. In general, a larger ratio $A_g/A_p$ increases etching rate. The conductor ring 430, when grounded, may have an effect of increasing the upper electrode area $A_g$ and thereby increase the efficiency of the apparatus shown at 300. The conductor ring 430 may be formed of non-ferromagnetic metal, such as aluminum which can be penetrated by magnetic fields.

Figure 7:
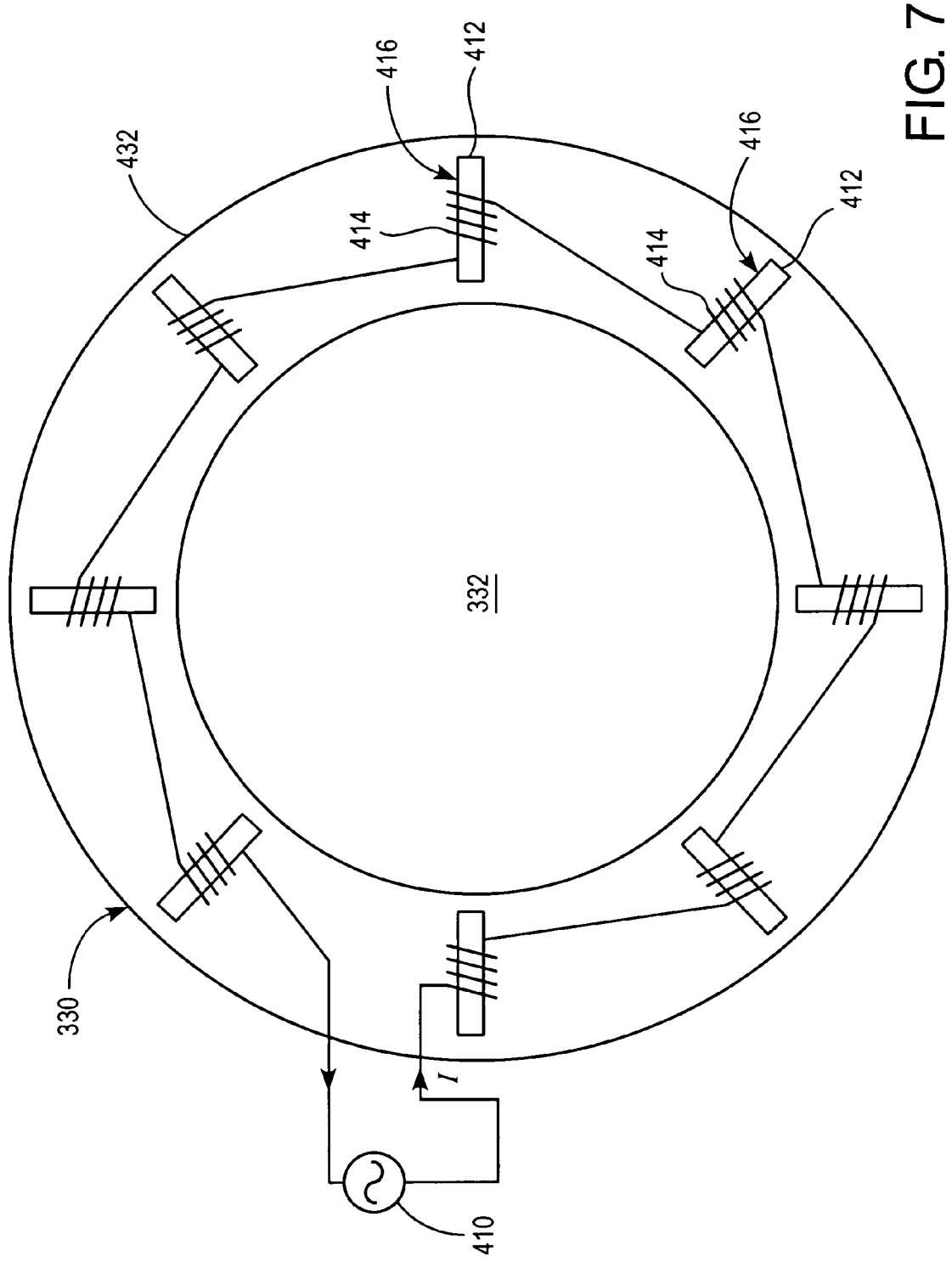
FIG. 7 shows a top plan view of the inductive RF source of the apparatus in FIG. 3.

FIG. 7 shows a top plan view of the inductive RF source 330 in FIG. 3. As depicted, each of the coil units 416 may be positioned on the dielectric support ring 432 or optionally on the conductor ring 430 (not shown in FIG. 7) and oriented along a radial direction of the dielectric support ring 432. The coils 414 may be wound around the ferromagnetic cores 412 and connected in series to the RF power source 410. In FIG. 7, the inductive RF source 330 is shown to have eight coil units. However, it should be apparent to those of ordinary skill that other numbers of coil units may be used in the inductive RF source 330.

Figure 8:
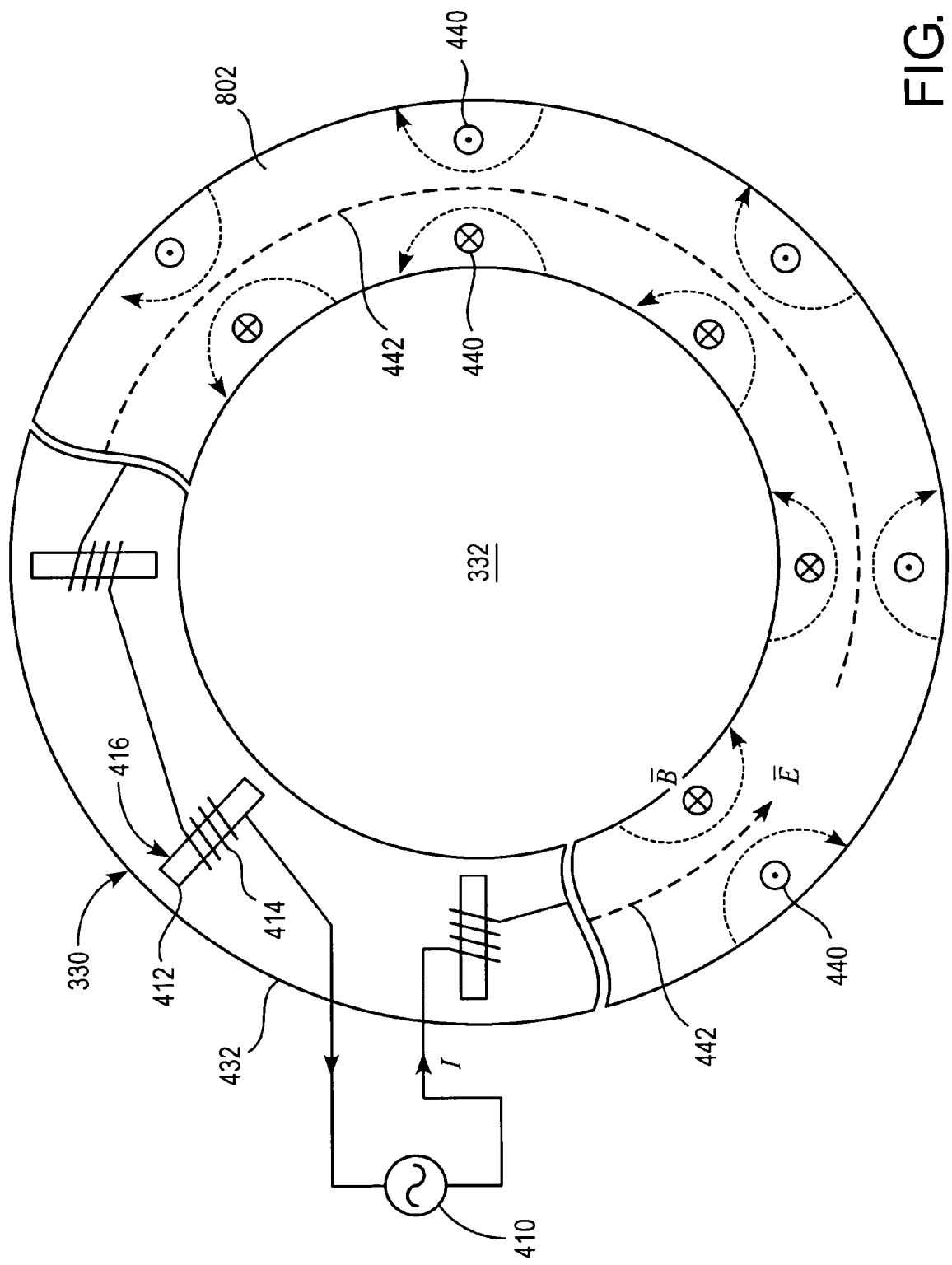
FIG. 8 shows a partial cut away view of the inductive RF source in FIG. 7, illustrating the electric and magnetic fields generated by the inductive RF source.

FIG. 8 shows a partial cut away view of the inductive RF source 330 in FIG. 7 during operation, illustrating the electric and magnetic fields generated by the inductive RF source 330 around the upper electrode 332. As depicted, the electric and magnetic fields 442, 440 may be formed in an annular region 802 around the upper electrode 332 and under the dielectric support ring 432. The electric field 442 may be directed in the circumferential direction of the annular region 802. As charged particles may travel along the electrical field 442, the ion and electrons in the annular region 802 may be confined within the annular region, rather than diffuse away from the annular region in radial directions of the dielectric support ring 432. Accordingly, the plasma can be confined by the magnetic and electric fields 440, 442 generated by the inductive RF source 330.

Figure 9:
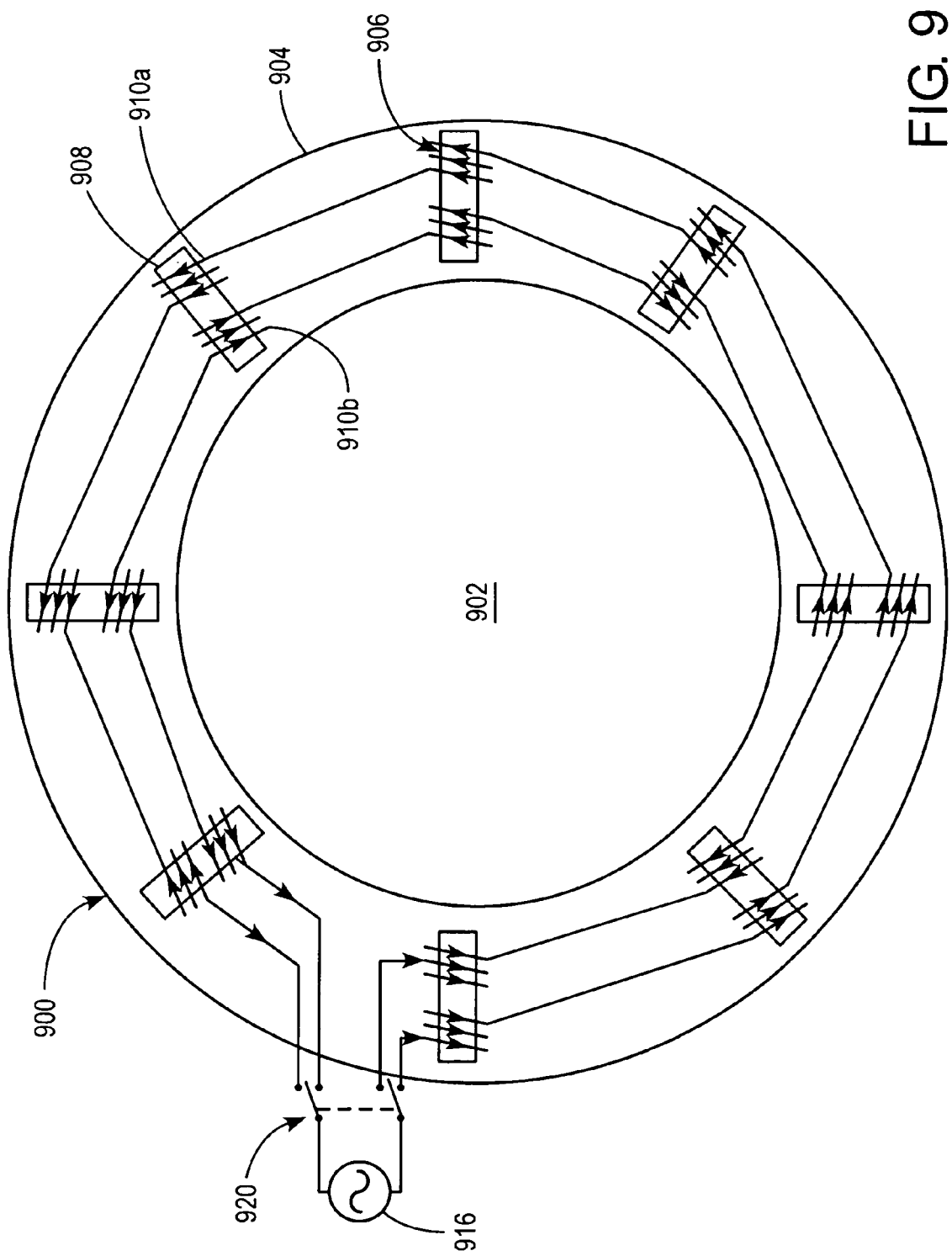
FIG. 9 shows a top plan view of an alternative embodiment of the inductive RF source depicted in FIG. 7.

FIG. 9 shows a top plan view of an alternative embodiment 900 of the inductive plasma source in FIG. 7. The inductive plasma source 900 may be positioned around the upper electrode and include: one RF power source 916; a plurality of coil units 906, each unit having a ferromagnetic core 908 and two coils 910a-910b wound around the core 908; and a dielectric support ring 904 for supporting the coil units 908. The inductive source 900 may optionally include a conductor ring (not shown in FIG. 9) positioned on the dielectric support ring 904. Preferred frequency ranges of the RF source 916 may be from 10 KHz to 1 MHz. Each of the coils 910a-910b may be connected in series with another coil of a neighboring coil unit which is wound in the same direction (outer coils 910a) or in an opposite direction (inner coils 910b) and coupled to the RF power source 916 by a switching arrangement 920 which supplies RF power to either the inner coils 910b or the outer coils 910a. As in the case of FIG. 7, the inductive RF source 900 may include other numbers of coil units 906.

Figure 10:
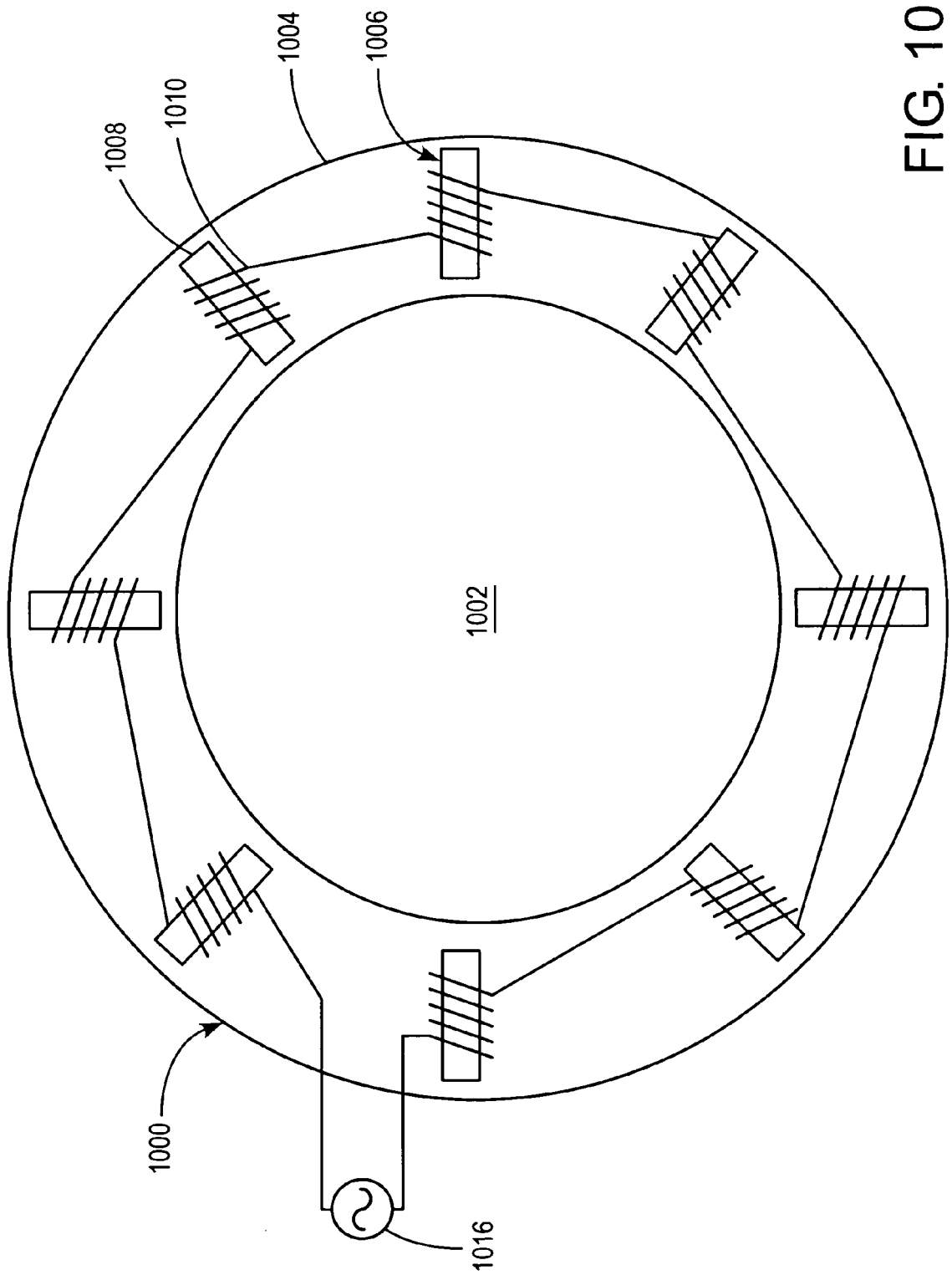
FIG. 10 shows a top plan view of another alternative embodiment of the inductive RF source depicted in FIG. 7.
Figure 11:
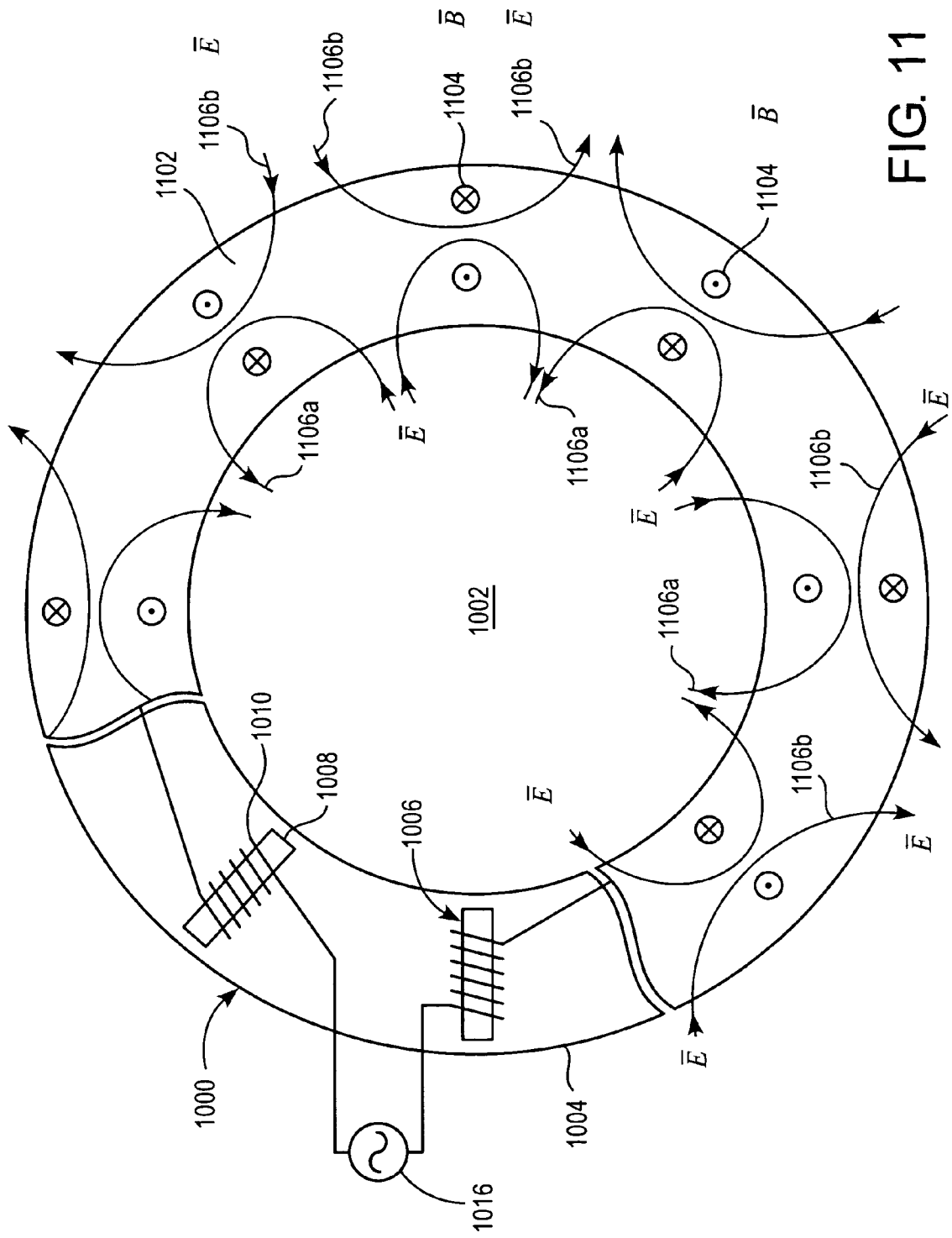
FIG. 11 shows a partial cut away view of the inductive RF source in FIG. 10, illustrating the electric and magnetic fields generated by the inductive RF source.

FIG. 10 shows a top plan view of another alternative embodiment 1000 of the inductive RF source 330 in FIG. 3. As depicted, the inductive RF source 1000 may include: an RF source 1016; a plurality of coil units 1006, each coil unit having a ferromagnetic core 1008 and a coil 1010 wound around the core and connected to the RF source 1016; and a dielectric support ring 1004 for supporting the coil units 1006 and positioned around the upper electrode 1002. The inductive RF source 1000 may optionally include a conductor ring (not shown in FIG. 10) positioned on the dielectric support ring 1004. Preferred frequencies of the RF source 1016 may be from 10 KHz to 1 MHz. The inductive plasma source 1000 may be similar to the inductive plasma source 330 with the difference that coils 1010 in two neighboring ferromagnetic cores 1108 may be wound in opposite directions to each other, which generates electric and magnetic fields having alternating directions, as depicted in FIG. 11. The inductive RF source 1000 may include other suitable number of coil units 1006.

FIG. 11 shows a partial cut away view of the inductive RF source 1000 in FIG. 10 during operation, illustrating the electric and magnetic fields generated by the inductive RF source 1000. As depicted, the magnetic fields 1104 may be formed in an annular region 1102 that surrounds the upper electrode 1002 and is located under the dielectric support ring 1004. The inductive RF source 1000 may generate inner electric fields 1106a and outer electric fields 1106b. As depicted in FIG. 11, the direction of two neighboring magnetic fields 1104 may be oriented in opposite directions. Likewise, the two neighboring inner (or outer) electric fields 1106a (1106b) may be oriented in opposite directions. The configuration of the inner electric fields 1106a may reduce the number of charged particles diffusing outside of the region 1102, while the outer electric fields 1106b may increase the diffusion of electrons out of the region 1102, which provides an additional knob for process tunability. The configuration of the outer electric fields 1106b may be applied to plasma processes with high etch rate at the edge of the substrate, where plasma density is usually higher at the edge than the center of the substrate.

As depicted in FIGS. 7, 9 and 10, a coil wound around a ferromagnetic core may be connected to neighboring coils in series. When the electron number density of the plasma is perturbed at a location within an annular region, such as 802, the electric field intensity at the location may also change.

Subsequently, the strength of the magnetic field around the location may be perturbed, which may induce a change in the current flowing through the coil corresponding to the perturbed magnetic field. Then, the change in the current may vary the current flowing through the coil in a direction to compensate the perturbation of the electron number density, thereby forming an instant feedback mechanism to stabilize the electron number density fluctuation. See V. Godyak, V. Lee, C. Chung *"Characterization of Inductively Coupled Plasma Driven with Ferrite Cores at 400 kHz"* 2005 *IEEE International Conference on Plasma Science*, June 20-23, Monterey, Calif.

While the invention has been described in detail with reference to specific embodiments thereof, it will be apparent to those skilled in the art that various changes and modifications can be made, and equivalents employed, without departing from the scope of the appended claims.

What is claimed is:

1. A device for confining plasma formed in a plasma processing apparatus that includes an upper electrode opposite a lower electrode, said lower electrode being adapted to support a substrate thereover and wherein plasma is generated between said substrate and said upper electrode during operation, said device comprising:
    a dielectric support ring adapted to concentrically surround said upper electrode; and
    a plurality of coil units spaced apart in a circumferential direction and mounted on said dielectric support ring, each of said coil units including a semicircular or U-shaped ferromagnetic core positioned on and parallel to a radial line originating from a center of said dielectric support ring and a first coil wound around said ferromagnetic core and coupled to a first radio frequency (RF) power source, said ferromagnetic core of each of said coil units having two ends on said radial line originating from the center of the dielectric support ring and the ends facing the dielectric support ring,
    wherein said coil units, upon receiving RF power from said first RF power source, generate electric and magnetic fields that confine said plasma.

2. A device as recited in claim 1, further comprising a conductor ring positioned on said dielectric support ring and adapted to increase an effective grounded area of the upper electrode.

3. A device as recited in claim 2, wherein said conductor ring is formed of non-ferromagnetic metal and the ferromagnetic cores have the first coil wound around a central portion of each ferromagnetic core.

4. A device as recited in claim 1, wherein the frequency of said first RF power source ranges from 10 KHz to 1 MHz and at least eight coil units are mounted on the dielectric support ring with the same spacing between adjacent coil units.

5. A device as recited in claim 1, wherein said coils are wound in the same direction and wherein said electric field is formed in the circumferential direction of said dielectric support ring.

6. A device as recited in claim 1, wherein each of said coil units further includes a second coil wound around said ferromagnetic core and coupled to the RF power source, the first coil being at one of the ends of the ferromagnetic core and the second coil being at the other of the ends of the ferromagnetic core with a space separating the first and second coils.

7. A device as recited in claim 6, wherein the first coils and the second coils are connected in series to a single RF source and RF power is supplied to the first coils or to the second coils by a switching arrangement.

8. A device as recited in claim 1, wherein adjacent coil units are wound in opposite directions.

9. A device as recited in claim 1, wherein a center axis of the coil of each of the coil units lies in a plane passing through the center of the dielectric ring.

10. A device as recited in claim 1, wherein the two ends of the ferromagnetic core of one of the coil units is offset by 180° from the two ends of the ferromagnetic core of another of the coil units.

11. A device as recited in claim 1, wherein the ferromagnetic cores of the coil units have the same length.

12. A plasma processing apparatus, comprising:
    a bottom electrode optionally coupled to a first radio frequency (RF) source;
    a chuck positioned on said bottom electrode and adapted to generate a clamping force on a substrate mounted thereon;
    an upper electrode optionally coupled to the first RF source and positioned over said chuck, said bottom electrode and upper electrode being adapted to generate plasma in a space between the upper and lower electrodes by supplying RF power to one of the electrodes by the first radio frequency (RF) source;
    a dielectric support ring surrounding the upper electrode; and
    a plurality of coil units spaced apart in a circumferential direction and mounted on said dielectric support ring, each of said coil units including a semicircular or U-shaped ferromagnetic core positioned on and parallel to a radial line originating from a center of said dielectric support ring and a first coil wound around said ferromagnetic core and coupled to a second radio frequency (RF) power source, said ferromagnetic core of each of said coil units having two ends on said radial line originating from the center of the dielectric support ring and the ends facing the dielectric support ring,
    wherein said coil units generate, upon receiving RF power from said second RF power source, electric and magnetic fields that confine said plasma.

13. A plasma processing apparatus as recited in claim 12, further comprising a conductor ring positioned on said dielectric support ring and adapted to increase an effective grounded area of the upper electrode.

14. A plasma processing apparatus as recited in claim 12, wherein the frequency of said second RF power source ranges from 10 KHz to 1 MHz and/or at least eight coil units are mounted on the dielectric support ring with the same spacing between adjacent coil units.

15. A plasma processing apparatus as recited in claim 12, wherein said first coils are wound in the same direction and wherein said electric field is formed in the circumferential direction of said dielectric support ring.

16. A plasma processing apparatus as recited in claim 12, wherein each of said coil units further includes a second coil wound around said ferromagnetic core and coupled to the second RF power source, the first coil being at one of the ends of the ferromagnetic core and the second coil being at the other of the ends of the ferromagnetic core with a space separating the first and second coils, the first coils or the second coils being supplied RF power through a switching arrangement.

17. A plasma processing apparatus as recited in claim 16, wherein the first coils are connected in series and wound in the same direction around the ferromagnetic cores and the second coils are connected in series and wound in opposite directions.

18. A plasma processing apparatus as recited in claim 12, wherein adjacent coil units are wound in opposite directions.

19. A plasma processing apparatus as recited in claim 12, wherein said first RF power source is a single frequency RF source at a single RF frequency or multiple-frequency RF sources at different frequencies.

20. A plasma processing apparatus as recited in claim 19, further comprising one or more matching networks interposed between said first RF power source and said upper or lower electrode.

21. A plasma processing apparatus as recited in claim 19, further comprising a capacitor interposed between said first RF power source and said upper or lower electrode.

22. A plasma processing apparatus as recited in claim 12, wherein said bottom electrode is coupled to the first RF source and the upper electrode is coupled to a third RF power source selected from a single frequency RF source or a multiple-frequency RF source.

23. A plasma processing apparatus as recited in claim 22, further comprising one or more matching networks interposed between said third RF power source and said upper electrode.

24. A plasma processing apparatus as recited in claim 22, further comprising a capacitor interposed between said third RF power source and said upper electrode.

25. A plasma processing apparatus as recited in claim 22, further comprising a switch for connecting said upper electrode to said third RF power source or ground.

26. A plasma processing apparatus as recited in claim 12, wherein said chuck is an electrostatic chuck.

27. A plasma processing apparatus as recited in claim 12, further including a gas injection system for injecting a flow of process gas into said plasma processing apparatus.

28. A plasma processing apparatus as recited in claim 12, further comprising a plurality of confinement rings surrounding said electric and magnetic fields.

\* \* \* \* \*